US012381526B2

United States Patent
Yamauchi et al.

(10) Patent No.: US 12,381,526 B2
(45) Date of Patent: Aug. 5, 2025

(54) AMPLIFIER CIRCUIT AND SENSOR CIRCUIT

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Akira Yamauchi, Yokohama Kanagawa (JP); Hiroshi Yoshino, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 534 days.

(21) Appl. No.: 17/930,061

(22) Filed: Sep. 6, 2022

(65) Prior Publication Data

US 2023/0318550 A1 Oct. 5, 2023

(30) Foreign Application Priority Data

Mar. 24, 2022 (JP) .................... 2022-048355

(51) Int. Cl.
*H03F 3/45* (2006.01)
*G01R 1/30* (2006.01)
(Continued)

(52) U.S. Cl.
CPC .......... *H03F 3/45076* (2013.01); *G01R 1/30* (2013.01); *G01R 33/07* (2013.01); *H03F 3/005* (2013.01)

(58) Field of Classification Search
CPC ............... H03F 3/45076; H03F 3/005; H03F 2200/156; H03F 2200/159; H03F 2200/252; H03F 2200/312; H03F 2200/417; H03F 2203/45038; H03F 2203/45536; H03F 2203/45544; H03F 2203/45616;
(Continued)

(56) References Cited

U.S. PATENT DOCUMENTS 5,880,586 A * 3/1999 Dukart ................. G01R 33/077
324/207.2
7,570,044 B2 8/2009 Takeda
(Continued)

FOREIGN PATENT DOCUMENTS

JP S62-208683 A 9/1987
JP 2011-61726 A 3/2011
(Continued)

OTHER PUBLICATIONS

Japan Patent Office, Office Action in JP App. No. 2022-048355, 3 pages, and machine translation, 6 pages (Apr. 1, 2025).

*Primary Examiner* — Hieu P Nguyen
(74) *Attorney, Agent, or Firm* — Finnegan, Henderson, Farabow, Garrett & Dunner, LLP (57) ABSTRACT

According to an embodiment, there is provided an amplifier circuit including a first capacitive element, a first GM amplifier, and a second GM amplifier. The first GM amplifier includes a first input node, a second input node, and an output node. The output node is connected to one end of the first capacitive element. The second GM amplifier includes a first input node, a second input node, and an output node. The output node is connected to one end of the first capacitive element and the second input node.

20 Claims, 7 Drawing Sheets

(51) Int. Cl.
*G01R 33/07* (2006.01)
*H03F 3/00* (2006.01)

(58) Field of Classification Search
CPC ....... H03F 2203/45681; H03F 3/45475; H03F 2200/375; H03F 2203/45548; H03F 2203/45712; H03F 1/26; G01R 1/30; G01R 33/07; G01B 7/003
USPC .................................................. 330/252–261
See application file for complete search history.

(56) References Cited

U.S. PATENT DOCUMENTS

| | | |
|---|---|---|
| 8,013,671 B2 | 9/2011 | Kumamoto et al. |
| 10,309,021 B2 | 6/2019 | Chen et al. |
| 11,009,563 B2 | 5/2021 | Ruck et al. |
| 2009/0108929 A1 | 4/2009 | Yan |
| 2010/0164770 A1 | 7/2010 | Wan et al. |
| 2010/0237936 A1 | 9/2010 | Takeda |
| 2011/0063029 A1 | 3/2011 | Kumamoto et al. |
| 2013/0127526 A1 | 5/2013 | Sayuk |
| 2015/0203978 A1 | 7/2015 | Chen et al. |
| 2017/0234910 A1 | 8/2017 | Nakamura et al. |

FOREIGN PATENT DOCUMENTS

| | | |
|---|---|---|
| JP | 4956573 B2 | 6/2012 |
| JP | 2019-114901 A | 7/2019 |
| JP | 2021-93683 A | 6/2021 |
| WO | WO 2014/015590 A1 | 1/2014 |

\* cited by examiner

| PHASE | STATES OF CONTROL SIGNALS SEL1, SEL2, AND SW1 | | |
|---|---|---|---|
| | SEL1 | SEL2 | SW1 |
| PHASE PH1 | L-LEVEL (VREF1) | L-LEVEL (VREF1) | H-LEVEL (CLOSE) |
| PHASE PH2 | H-LEVEL (INP) | H-LEVEL (INM) | L-LEVEL (OPEN) |

AMPLIFIER CIRCUIT AND SENSOR CIRCUIT

CROSS-REFERENCE TO RELATED APPLICATIONS

This application is based upon and claims the benefit of priority from Japanese Patent Application No. 2022-048355, filed on Mar. 24, 2022; the entire contents of which are incorporated herein by reference.

FIELD

Embodiments described herein relate generally to an amplifier circuit and a sensor circuit.

BACKGROUND

An amplifier circuit connected to a sensor amplifies a weak signal from the sensor and outputs the amplified signal. At this time, the amplifier circuit is desired to amplify the signal highly accurately.

DETAILED DESCRIPTION

In general, according to one embodiment, there is provided an amplifier circuit including a first capacitive element, a first GM amplifier, a second GM amplifier, a switch, a second capacitive element, a first selector circuit, and a second selector circuit. The first GM amplifier includes a first input node, a second input node, and an output node. The output node of the first GM amplifier is connected to one end of the first capacitive element. The second GM amplifier includes a first input node, a second input node, and an output node. The output node of the second GM amplifier is connected to the one end of the first capacitive element. The switch has one end connected to the output node of the second GM amplifier, and the other end connected to the second input node of the second GM amplifier. The second capacitive element has one end connected to the first input node of the second GM amplifier, and the other end connected to the second input node of the second GM amplifier. The first selector circuit switches between a first state and a second state. The first state is a state where a first input terminal and the first input node of the first GM amplifier are connected. The second state is a state where first reference voltage and the first input node of the first GM amplifier are connected. The second selector circuit switches between a third state and a fourth state. The third state is a state where a second input terminal and the second input node of the first GM amplifier are connected. The fourth state is a state where the first reference voltage and the second input node of the first GM amplifier are connected. The first reference voltage is connected to the first input node of the second GM amplifier.

Exemplary embodiments of an amplifier circuit will be explained below in detail with reference to the accompanying drawings. The present invention is not limited to the following embodiments.

EMBODIMENT

Figure 1:
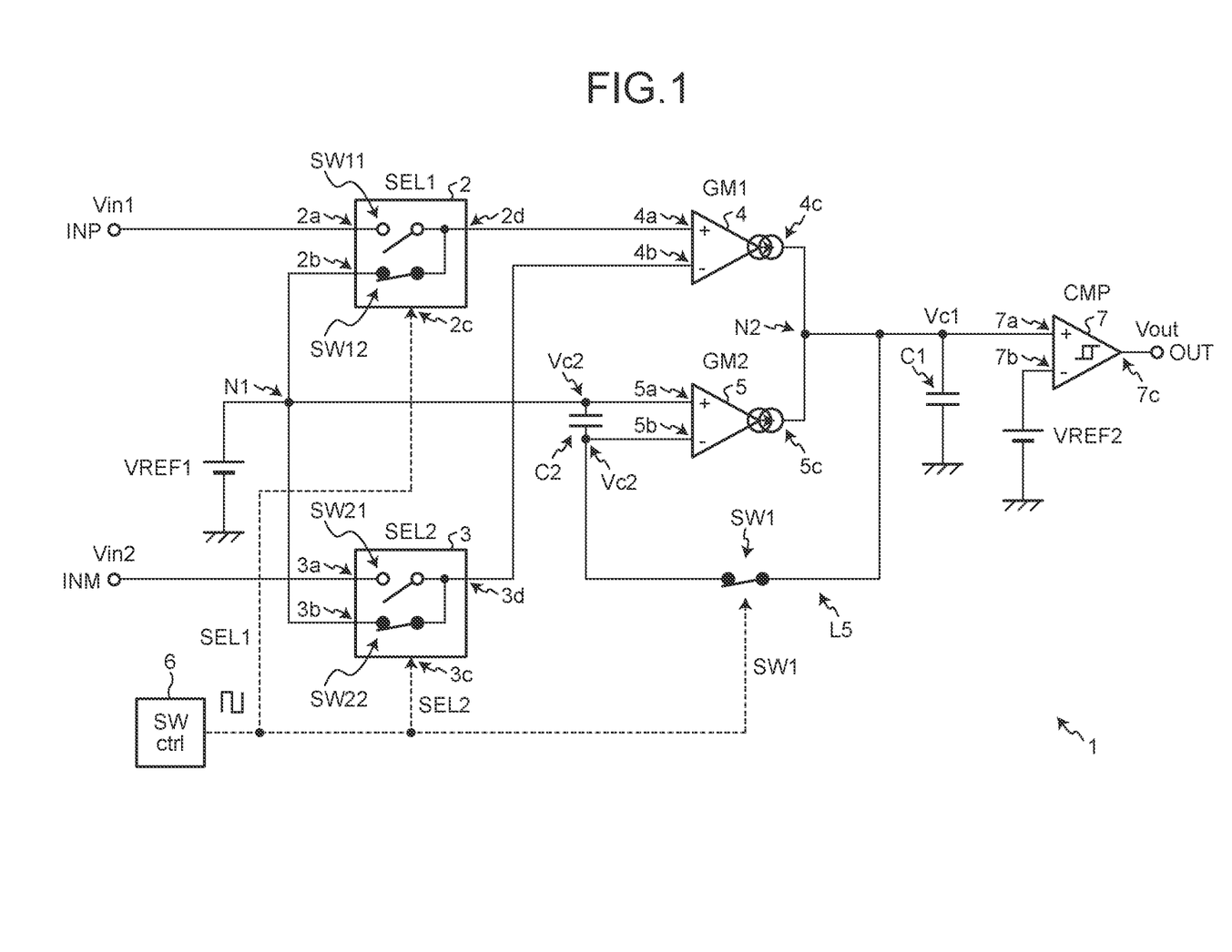
FIG. 1 is a diagram illustrating a configuration of an amplifier circuit according to an embodiment.

An amplifier circuit according to the embodiment is connected to a sensor, amplifies a weak signal from the sensor and outputs the amplified signal, being devised to amplify a signal highly accurately. For example, in a case where the sensor outputs s differential signal, an amplifier circuit 1 may be configured as an amplifier circuit with differential input and single output as illustrated in FIG. 1. FIG. 1 is a diagram illustrating a configuration of the amplifier circuit 1.

The amplifier circuit 1 receives a differential signal Vin1-Vin2 between a sensor signal Vin1 and a sensor signal Vin2, at an input terminal INP and an input terminal INM. The sensor signal that is weak is affected by disturbance noise, but the influence of the disturbance noise can be reduced by receiving the sensor signal as the differential signal. The amplifier circuit 1 performs processing such as amplification on the differential signal Vin1-Vin2 to output voltage Vc1, and outputs a signal $V_{OUT}$ after processing from an output terminal OUT. The signal $V_{OUT}$ may be a single-end signal.

The amplifier circuit 1 includes a selector circuit (SEL1) 2, a selector circuit (SEL2) 3, a GM amplifier (GM1) 4, a GM amplifier (GM2) 5, a capacitive element C1, a capacitive element C2, a switch SW1, a control circuit (SW ctrl) 6, and a comparator (CMP) 7.

A node N1 is connected to a reference voltage VREF1. The reference voltage VREF1 may have substantially the same level as a reference level of the signals received at the input terminals INP and INM.

The selector circuit 2 is connected between the input terminal INP and the reference voltage VREF1, and the GM amplifier 4. The selector circuit 2 includes an input node 2a that is connected to the input terminal INP, an input node 2b that is connected to the reference voltage VREF1 via the node N1, a control node 2c that is connected to the control circuit 6, and an output node 2d that is connected to a non-inverting input terminal 4a of the GM amplifier 4.

The selector circuit 2 is configured to be switched between a first connection state and a second connection state according to a control signal SEL1 from the control circuit 6. The first connection state is a state in which the input terminal INP is connected to the non-inverting input terminal 4a of the GM amplifier 4. In the first connection state, the selector circuit 2 selects and outputs a signal from the input terminal INP. The second connection state is a state in which the reference voltage VREF1 is connected to the non-inverting input terminal 4a of the GM amplifier 4. In the second connection state, the selector circuit 2 selects and outputs the reference voltage VREF1.

The selector circuit 2 is switched to the first connection state by connecting the input node 2a and the output node 2d and interrupting the input node 2b and the output node 2d, and is switched to the second connection state by interrupting the input node 2a and the output node 2d, and connecting the input node 2b and the output node 2d.

The selector circuit 2 includes a switch SW11 and a switch SW12. The switch SW11 has one end that is connected to the input terminal INP, the other end that is connected to the non-inverting input terminal 4a of the GM amplifier 4, and a control terminal that is connected to the control circuit 6. The switch SW12 has one end that is connected to the reference voltage VREF1 via the node N1, the other end that is connected to the non-inverting input terminal 4a of the GM amplifier 4, and a control terminal that is connected to the control circuit 6.

The switch SW11 and the switch SW12 are turned on and off complementarily in accordance with the level of the control signal SEL1. For example, when the control signal SEL1 is at an L level, the switch SW11 is turned on, and the switch SW12 is turned off. Thus, the selector circuit 2 is switched to the first connection state. When the control signal SEL1 is at an H level, the switch SW11 is turned off, and the switch SW12 is turned on. Thus, the selector circuit 2 is switched to the second connection state.

The selector circuit 3 is connected between the input terminal INM and the reference voltage VREF1, and the GM amplifier 4. The selector circuit 3 includes an input node 3a that is connected to the input terminal INM, an input node 3b that is connected to the reference voltage VREF1 via the node N1, a control node 3c that is connected to the control circuit 6, and an output node 3d that is connected to an inverting input terminal 4b of the GM amplifier 4.

The selector circuit 3 is configured to be switched between a third connection state and a fourth connection state according to a control signal SEL2 from the control circuit 6. The third connection state is a state in which the input terminal INM is connected to the inverting input terminal 4b of the GM amplifier 4. In the third connection state, the selector circuit 3 selects and outputs a signal from the input terminal INM. The fourth connection state is a state in which the reference voltage VREF1 is connected to the inverting input terminal 4b of the GM amplifier 4. In the fourth connection state, the selector circuit 3 selects and outputs the reference voltage VREF1.

The selector circuit 3 is switched to the third connection state by connecting the input node 3a and the output node 3d and interrupting the input node 3b and the output node 3d, and switches to the fourth connection state by interrupting the input node 3a and the output node 3d and connecting the input node 3b and the output node 3d.

The selector circuit 3 includes a switch SW21 and a switch SW22. The switch SW21 has one end that is connected to the input terminal INM, the other end that is connected to the inverting input terminal 4b of the GM amplifier 4, and a control terminal that is connected to the control circuit 6. The switch SW22 has one end that is connected to the reference voltage VREF1 via the node N1, the other end that is connected to the inverting input terminal 4b of the GM amplifier 4, and a control terminal is connected to the control circuit 6.

The switch SW21 and the switch SW22 are turned on and off complementarily in accordance with the level of the control signal SEL2. For example, when the control signal SEL2 is at an L level, the switch SW21 is turned on, and the switch SW22 is turned off. Thus, the selector circuit 3 is switched to the third connection state. When the control signal SEL2 is at an H level, the switch SW21 is turned off, and the switch SW22 is turned on. Thus, the selector circuit 3 is switched to the fourth connection state.

The GM amplifier 4 is connected between the selector circuit 2 and the selector circuit 3, and the capacitive element C1 and the comparator 7. The GM amplifier 4 includes the non-inverting input terminal 4a that is connected to the selector circuit 2, the inverting input terminal 4b that is connected to the selector circuit 3, and an output terminal 4c that is connected to one end of the capacitive element C1 and a non-inverting input terminal 7a of the comparator 7 via a node N2.

The GM amplifier 4 outputs, from the output terminal 4c, a current according to a difference between a voltage received at the non-inverting input terminal 4a and a voltage received at the inverting input terminal 4b and an offset voltage generated by the GM amplifier 4 itself. When the selector circuit 2 is in the first connection state and the selector circuit 3 is in the third connection state, the GM amplifier 4 outputs, from the output terminal 4c, a current according to a difference in voltage between the input terminals INP and INM and the offset voltage generated by the GM amplifier 4 itself. When the selector circuit 2 is in the second connection state and the selector circuit 3 is in the fourth connection state, the reference voltage VREF1 is connected to the input terminals INP and INM of the GM amplifier 4. Since there is no difference in voltage between the input terminals INP and INM, a current corresponding to the offset voltage generated by the GM amplifier 4 itself is output.

The GM amplifier 5 is connected between the node N1, and the capacitive element C1 and the comparator 7. The GM amplifier 5 includes a non-inverting input terminal 5a that is connected to one end of the capacitive element C2 and that is connected to the reference voltage VREF1 via the node N1. An inverting input terminal 5b is connected to the other end of the capacitive element C2. An output terminal 5c is connected to the one end of the capacitive element C1 and the non-inverting input terminal 7a of the comparator 7, via the node N2, and is connected to the inverting input terminal 5b via the node N2 and the switch SW1.

In other words, the GM amplifier 5 includes a line L5 having a feedback-connection from the output terminal 5c to the inverting input terminal 5b. The GM amplifier 5 and the line L5 constitute a voltage follower.

The GM amplifier 5 outputs, from the output terminal 5c, a current according to a difference between a voltage received at the non-inverting input terminal 5a and a voltage received at the inverting input terminal 5b, or a current according to a voltage follower operation.

The capacitive element C1 is charged with a combined current of an output current from the GM amplifier 4 and an output current from the GM amplifier 5. The capacitive element C1 is connected between the GM amplifier 4 and the GM amplifier 5, and the comparator 7. The capacitive element C1 has the one end that is connected to the output terminal 4c of the GM amplifier 4 and the output terminal 5c of the GM amplifier 5, via the node N2, and that is connected to the non-inverting input terminal 7a of the comparator 7. The capacitive element C1 has the other end that is connected to a reference potential (e.g., ground potential).

The capacitive element C2 holds a voltage fed back to the inverting input terminal 5b of the GM amplifier 5 through the line L5. The capacitive element C2 is connected between the node N2 and the line L5, and is connected between the non-inverting input terminal 5a and the inverting input terminal 5b of the GM amplifier 5. The capacitive element C2 has the one end that is connected to the line L5 and the inverting input terminal 5b of the GM amplifier 5, and the other end that is connected to the node N1 and the non-inverting input terminal 5a of the GM amplifier 5.

The switch SW1 is turned on to activate the line L5, and is turned off to inactivate the line L5. In other words, the switch SW1 is turned on to cause the GM amplifier 5 to perform the voltage follower operation, and turned off to cancel the voltage follower operation of the GM amplifier 5. The switch SW1 is arranged on the line L5, and is connected between the output terminal 5c and the inverting input terminal 5b of the GM amplifier 5. The switch SW1 has the one end that is connected to the output terminal 5c of the GM amplifier 5 via the node N2, the other end that is connected to the inverting input terminal 5b of the GM amplifier 5, and a control terminal that is connected to the control circuit 6. When the selector circuit 2 is in the first connection state and the selector circuit 3 is in the third connection state, the switch SW1 is turned off, and when the selector circuit 2 is in the second connection state and the selector circuit 3 is in the fourth connection state, the switch SW1 is turned on.

In other words, when the GM amplifier 4 outputs the current according to the offset generated by the GM amplifier 4 itself, the GM amplifier 5 activates the line L5 to perform the voltage follower operation, outputs a current for cancelling the offset, and holds, in the capacitive element C2, a voltage at the inverting input terminal 5b required to cancel the offset. When the line L5 is inactivated, the GM amplifier 5 cancels the current according to the offset generated by the GM amplifier 4 itself by using the voltage held in the capacitive element C2.

The comparator 7 is connected between the GM amplifier 4 and the GM amplifier 5, and the output terminal OUT. The comparator 7 includes the non-inverting input terminal 7a that is connected to the one end of the capacitive element C1, and that is connected to the output terminal 4c of the GM amplifier 4 and the output terminal 5c of the GM amplifier 5 via the node N2. The comparator 7 includes an inverting input terminal 7b that is connected to reference voltage VREF2, and an output terminal 7c that is connected to the output terminal OUT.

The comparator 7 has a hysteresis characteristic. When the voltage Vc1 rises, the comparator 7 performs comparison at a threshold Vt_h. When the voltage Vc1 is lower than the threshold Vt_h, the comparator 7 outputs an L level, and when the voltage Vc1 exceeds the threshold Vt_h, the comparator 7 outputs an H level. When the voltage Vc1 lowers, the comparator 7 performs comparison at a threshold Vt_1 (<Vt_h). When the voltage Vc1 is higher than the threshold Vt_1, the comparator 7 outputs the H level, and when the voltage Vc1 is lower than the threshold Vt_1, the comparator 7 outputs the H level.

The threshold Vt_h corresponds to the reference voltage VREF2, and the threshold Vt_1 corresponds to a voltage decreased by $\Delta V$ from the reference voltage VREF2. For example, the threshold Vt_h and the threshold Vt_1 may be determined so as to satisfy the following Mathematical formulas 1 to 3.

$$Vt\_1 < VREF1 < Vt\_h \quad \text{Mathematical formula 1}$$

$$Vt\_h = VREF2 \quad \text{Mathematical formula 2}$$

$$Vt\_1 = VREF2 - \Delta V (\Delta V > 0) \quad \text{Mathematical formula 3}$$

The comparator 7 is configured so that a switch in the comparator 7 is turned on at the threshold Vt_h to decrease the voltage at the inverting input terminal 7b by $\Delta V$, and thereby the hysteresis characteristic is provided to the comparator 7.

The control circuit 6 causes the control signals SEL1 and SEL2 to switch the connection states of the selector circuits 2 and 3. In addition, the control circuit 6 performs on/off control of the switch SW1 by using a control signal SW1.

One cycle of the operation of the amplifier circuit 1 includes a phase PH1 and a phase PH2. In the phase PH1, the GM amplifier 4 and the GM amplifier 5 are switched to the second connection state and the fourth connection state, and the outputs from the GM amplifier 4 and the GM amplifier 5 are both set to the reference voltage VREF1. Therefore, an offset component is stored in the capacitive element C2. In the phase PH2, a difference between the input signals Vin1 and Vin2 is amplified, the signal Vc1 after amplifying is compared with a determination threshold voltage Vth, and a result of the comparison is output. The phase PH1 is a phase for sampling and may be referred to as a sample phase. The phase PH2 is a phase for comparison, and may be referred to as a comparison phase.

Figure 2:
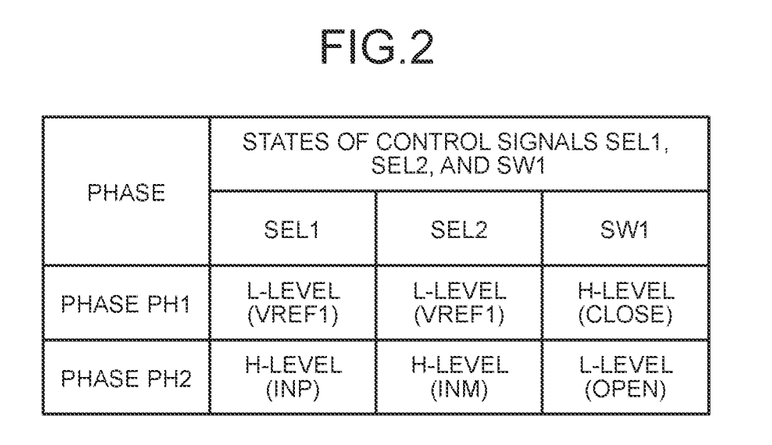
FIG. 2 is a table illustrating an operation in each phase of the amplifier circuit according to the embodiment.
Figure 3:
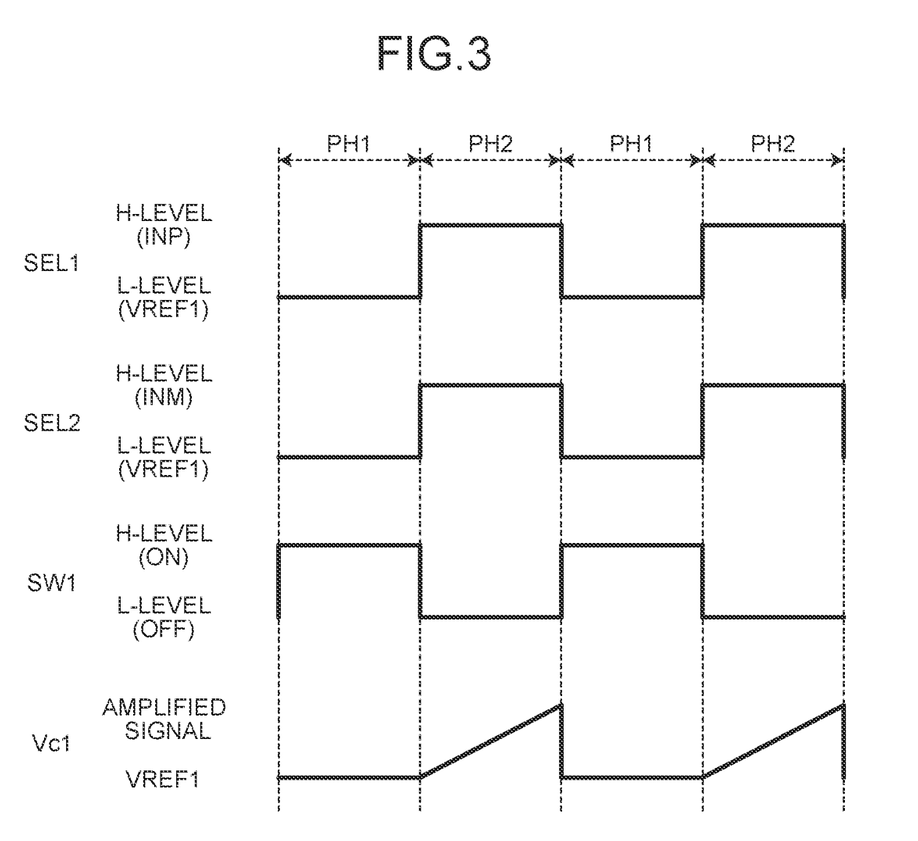
FIG. 3 is a waveform diagram illustrating operations of the amplifier circuit according to the embodiment.

In the amplifier circuit 1, the control circuit 6 maintains the levels of the control signals SEL1, SEL2, and SW1 in each of the phase PH1 and the phase PH2, as illustrated in FIG. 2. FIG. 2 is a table illustrating an operation in each of the phases PH1 and PH2 of the amplifier circuit 1. Furthermore, in the amplifier circuit 1, the control circuit 6 alternately performs the operation in the phase PH1 and the operation in the phase PH2 periodically, as illustrated in FIG. 3. FIG. 3 is a waveform diagram illustrating operations of the amplifier circuit 1.

As illustrated in FIG. 2, in the phase PH1, the control circuit 6 maintains the control signals SEL1, SEL2, and SW1 at the L level, the L level, and the H level, respectively. Accordingly, the selector circuit 2 connects the reference voltage VREF1 to the non-inverting input terminal 4a of the GM amplifier 4, and the selector circuit 3 connects the reference voltage VREF1 to the inverting input terminal 4b of the GM amplifier 4. The switch SW1 is maintained on (CLOSE). A combined current of a current obtained by converting a difference voltage between the input terminals 4a and 4b of the GM amplifier 4 and an output current obtained by converting a difference voltage between the input terminals 5a and 5b of the GM amplifier 5 flows into the capacitive element C1 and the capacitive element C2.

In the phase PH1, the GM amplifier 4 outputs a current according to the offset generated by the GM amplifier 4 itself to charge the capacitive element C1 and the capacitive element C2. The GM amplifier 5 controls Vc1 to the reference voltage VREF1 by the voltage follower operation. In other words, the GM amplifier 5 outputs the current for cancelling the current according to the offset of the GM amplifier 4, and holds the voltage at the inverting input terminal 5b required to cancel the offset, in the capacitive element C2.

The reference voltage VREF1 is input to both the input terminals 4a and 4b, and therefore, the GM amplifier 4 outputs the offset current of the GM amplifier 4. Since the GM amplifier 5 operates as the voltage follower to which the reference voltage VREF1 is input, the GM amplifier 5 sets the voltage of the capacitive element C1 to the reference voltage VREF1 and outputs cancel current for cancelling the offset current of the GM amplifier 4. The capacitive element C2 holds the input voltage to the GM amplifier 5 according to the cancel current. In addition, in the phase PH1, the non-inverting input terminal 7a of the comparator 7 is substantially maintained at the reference voltage VREF1 by the voltage follower operation of the GM amplifier 5, and therefore, the comparator 7 does not change a result of the comparison. For example, in a case where the comparator 7 has the hysteresis characteristic and Mathematical formula 1 holds, the L level is maintained as an output when the comparator 7 is in a state of performing the comparison by using the threshold Vt_h, and the H level is maintained as an output when the comparator 7 is in a state of performing the comparison by using the threshold Vt_1.

As illustrated in FIG. 2, in the phase PH2, the control circuit 6 maintains the control signals SEL1, SEL2, and SW1 at the H level, the H level, and the L level, respectively. Accordingly, the selector circuit 2 connects the input terminal INP to the non-inverting input terminal 4a of the GM amplifier 4, the selector circuit 3 connects the input terminal INM to the inverting input terminal 4b of the GM amplifier 4, and the switch SW1 is maintained off state (OPEN). The voltage held in the capacitive element C2 in the phase PH1 is held between the input terminals 5a and 5b of the GM amplifier 5. Therefore, a state in which the cancel current for cancelling the offset current of the GM amplifier 4 flows from the output terminal 5c of the GM amplifier 5 to the node N2 is maintained. In the phase PH2, the GM amplifier 4 outputs a current according to a difference between the input signals Vin1 and Vin2 to charge the capacitive element C1. In addition, one cycle of the operation is sufficiently shorter than the cycles of the input signals Vin1 and Vin2, and therefore, the input signals Vin1 and Vin2 can be regarded as a constant value in the one cycle, and the output current can also be regarded as a constant current. Therefore, the GM amplifier 4 performs differential amplification of the input signals Vin1 and Vin2 by charging the capacitive element C1 with the constant current according to the input signals for a certain period of time. The comparator 7 outputs a result of the comparison between the signal Vc1 after amplifying with the reference voltage VREF2.

Next, the voltage held in the capacitive element C1 and the capacitive element C2 will be described below in terms of a signal component and an offset component. A period of the phase PH1 is denoted by Tph1, and a period of the phase PH2 is denoted by Tph2, where the voltage applied to the input terminal INP is denoted by Vin1, the voltage applied to the input terminal INM is denoted by Vin2, the transconductance of the GM amplifier 4 is denoted by gm1, the transconductance of the GM amplifier 5 is denoted by gm2, output terminal voltage from the GM amplifier 4 and the GM amplifier 5 is denoted by Vc1, and a voltage between the terminals of the capacitive element C2 is denoted by Vc2.

The signal component will be described first.

Figure 4:
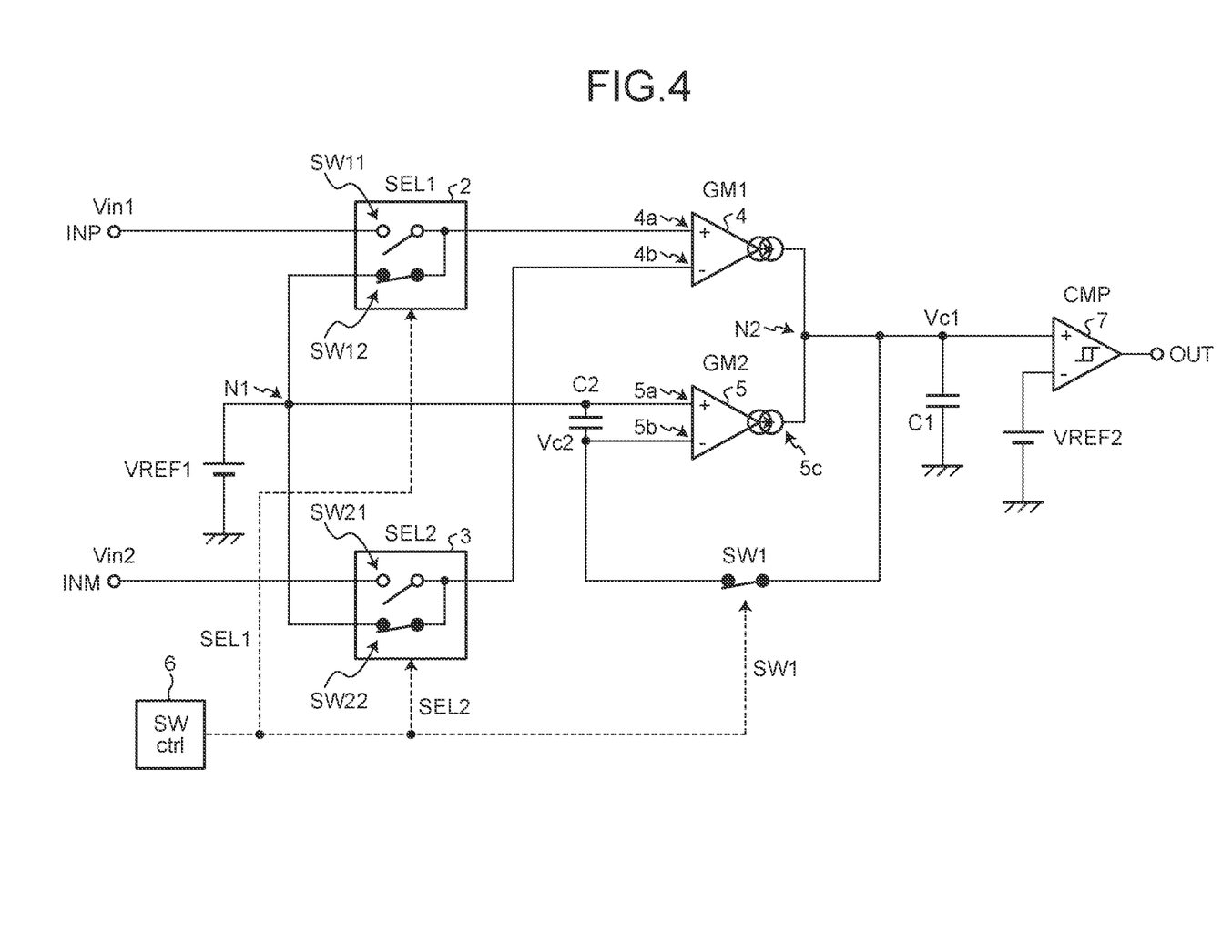
FIG. 4 is a diagram illustrating a connection state in a phase PH1, of the amplifier circuit according to the embodiment.

The connection states of the switches SW1, SW11, SW12, SW21, and SW22 in the phase PH1 are as illustrated in FIG. 4. FIG. 4 is a diagram illustrating a connection state of the amplifier circuit 1 in the phase PH1. The reference voltage VREF1 is applied to the non-inverting input terminal 4a and the inverting input terminal 4b of the GM amplifier 4, the reference voltage VREF1 is applied to the non-inverting input terminal 5a of the GM amplifier 5, and the voltage Vc1 fed back is applied to the inverting input terminal 5b. The switch SW1 is turned on, and therefore, the voltage Vc1 is applied to the inverting input terminal 5b of the GM amplifier 5. Accordingly, the voltages Vc1 output from the GM amplifier 4 and the GM amplifier 5 is represented by the following Mathematical formula 5, according to 1<<gm2/(C1+C2).

$$Vc1=\{gm1(VREF1-VREF1)+gm2(VREF1-Vc1)\}/(C1+C2)=gm2 \cdot VREF1/[(C1+C2)\{1+gm2/(C1+C2)\}] \approx VREF1 \quad \text{Mathematical formula 5}$$

As represented by Mathematical formula 5, the GM amplifier 5 operates as the voltage follower.

Since the switch SW1 is turned on, the voltage at the one end of the capacitive element C2 substantially equal to the voltage Vc1 at the one end of the capacitive element C1. The other end of the capacitive element C2 is substantially equal to the reference voltage VREF1. Therefore, the voltage Vc2 between the terminals of the capacitive element C2 is represented by the following Mathematical formula 6.

$$Vc2=VREF1-Vc1=0 \quad \text{Mathematical formula 6}$$

Figure 5:
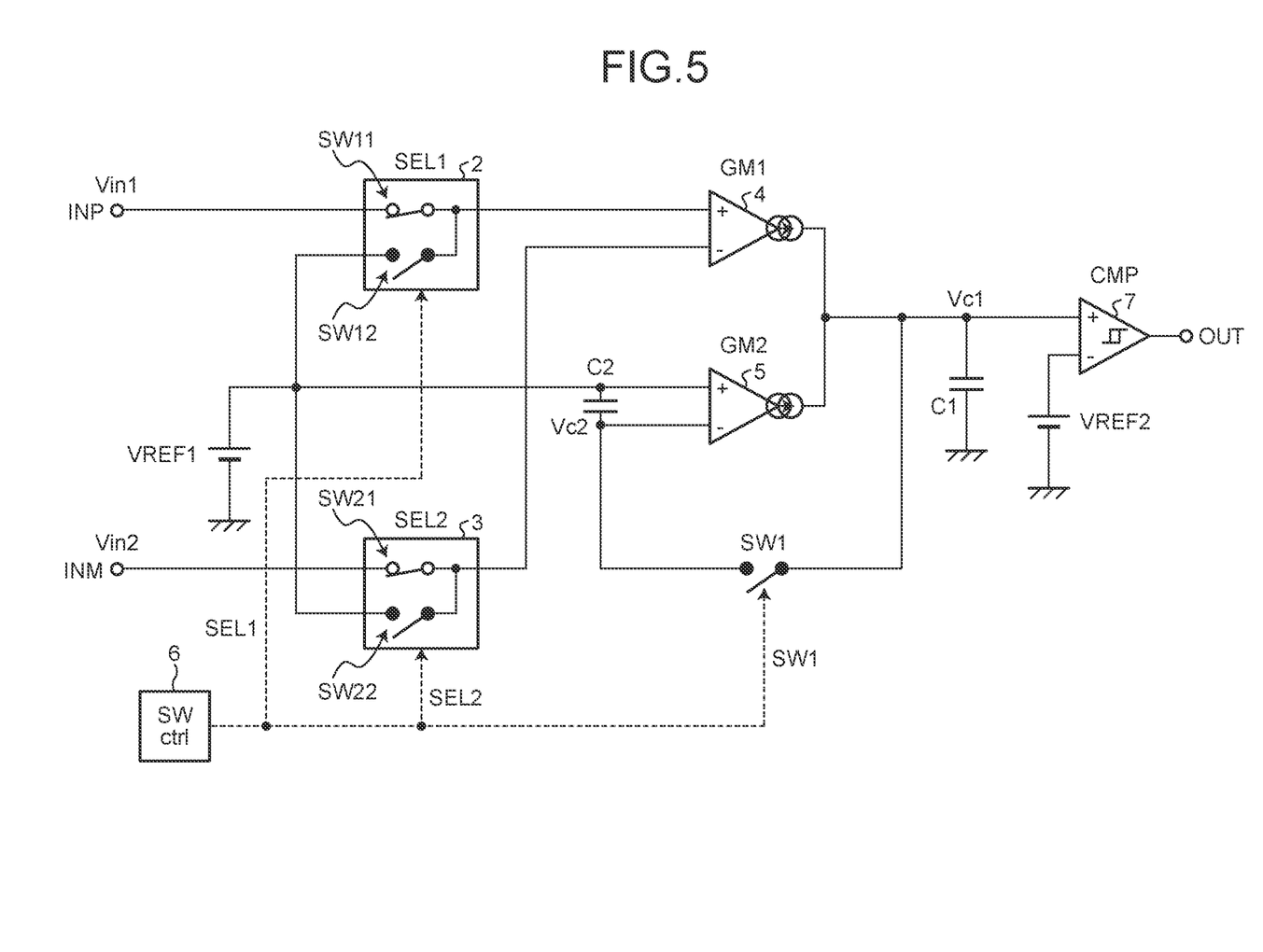
FIG. 5 is a diagram illustrating a connection state in a phase PH2, of the amplifier circuit according to the embodiment.

The connection states of the switches SW1, SW11, SW12, SW21, and SW22 in the phase PH2 are as illustrated in FIG. 5. FIG. 5 is a diagram illustrating a connection state of the amplifier circuit 1 in the phase PH2. A signal voltage Vin1 is applied to the non-inverting input terminal 4a of the GM amplifier 5, and a signal voltage Vin2 is applied to the inverting input terminal 4b. Therefore, the voltage Vc1 output from the GM amplifier 4 and the GM amplifier 5 is represented by the following Mathematical formula 7.

$$Vc1=\{gm1(Vin1-Vin2)+gm2(Vc2)\} \cdot Tph2/C1=gm1(Vin1-Vin2) \cdot Tph2/C1 \quad \text{Mathematical formula 7}$$

Mathematical formula 7 shows that the GM amplifier 4 and the GM amplifier 5 operate as amplifiers having a gain of gm1·Tph2/C1 to an input signal Vin1-Vin2. In other words, Mathematical formula 7 shows that a high-gain wide-band amplifier can be achieved by increasing the operation period Tph2 and reducing the size of C1.

Next, the offset component will be described.

It is assumed that the offset voltage input at the non-inverting input terminal 4a of the GM amplifier 4 is Vofs1, the offset voltage input at the inverting input terminal 4b is Vofs2, the offset voltage at the non-inverting input terminal 5a of the GM amplifier 5 is Vofs3, and the offset voltage at the inverting input terminal 5b is Vofs4.

In the phase PH1 (see FIG. 4), the difference voltage Vc2 input of the GM amplifier 5 is represented by the following Mathematical formula 8, according to 1<<gm2/(C1+C2).

$$-Vc2=Vofs3-Vofs4=\{gm1(Vofs1-Vofs2)+gm2(Vofs3-Vofs4)\}/(C1+C2)=-gm1/gm2(Vofs1-Vofs2) \quad \text{Mathematical formula 8}$$

The voltage Vc1 output from the GM amplifier 4 and the GM amplifier 5 in the phase PH2 (see FIG. 5) is represented by the following Mathematical formula 9.

$$Vc1=[gm1(Vofs1-Vofs2)+gm2(-Vc2)]/(C1+C2) \approx 0 \quad \text{Mathematical formula 9}$$

Mathematical formula 9 shows that the offset components of the GM amplifier 4 and the GM amplifier 5 are substantially cancelled, and the offset component does not substantially appear at the node N2. Therefore, a highly accurate amplifier can be achieved.

In this manner, in the amplifier circuit 1 of the present embodiment, the offset cancellation and amplification using the GM amplifiers 4 and 5, the capacitive elements C1 and C2, and the selector circuits 2 and 3 are performed, thus, achieving highly accurate, high-gain, and wide-band operation.

As described above, in the embodiment, the output terminal 4c of the GM amplifier 4 and the output terminal 5c of the GM amplifier 5 are connected in common to the one end of the capacitive element C1, in the amplifier circuit 1. This configuration makes it possible to supply a signal obtained by amplifying the differential signal by the GM amplifier 4 to the one end of the capacitive element C1 while supplying a correction component for the offset component from the GM amplifier 5 to the one end of the capacitive element C1. Therefore, the differential amplification processing can be performed by the GM amplifier 4 and the capacitive element C1 while offset correction is performed in real time, and thus, a high-accuracy and wide-band differential amplification can be achieved.

Furthermore, in the embodiment, the amplifier circuit 1 is configured so that the capacitive element C2 is connected between the input terminals 5a and 5b of the GM amplifier 5 and the output terminal 5c and input terminal 5b of the GM amplifier 5 are connected via the switch SW1. This configuration makes it possible to turn on the switch SW1 to perform the voltage follower operation by the GM amplifier 5, accumulating the offset components at both ends of the capacitive element C2. Then, the switch SW1 is turned off to cancel the voltage follower operation of the GM amplifier 5, making it possible to hold the offset component in the capacitive element C2. Therefore, it is possible that the correction component for the offset component is supplied from the GM amplifier 5 to the one end of the capacitive element C1 according to the offset component held in the capacitive element C2 and the offset correction is performed in parallel with the differential amplification processing.

For example, a magnetic sensor circuit using Hall effect is used as an alternate detection sensor that detects a rotational position of a motor. The magnetic sensor circuit includes a Hall element that generates an electromotive force proportional to a magnetic field or a magnetic flux density, an amplifier that amplifies an output of the Hall element, and a comparator that determines polarity of amplifier output. This magnetic sensor circuit is created on the same silicon chip as a motor driver, and therefore it is advantageous to reduce the device size. It is considered to use, as an amplifier, an instrumentation amplifier having an offset cancellation function for high accuracy and high gain amplification of a weak signal such as a Hall electromotive force, for a magnetic sensor circuit detecting opening and closing of a foldable mobile phone. This magnetic sensor circuit performs on/off control of a switch circuit at a switching frequency with two phases (phase PH1, phase PH2) as one cycle, in order to reduce the offset generated in the Hall element, the amplifier, or the comparator. It is desired to sufficiently increase the switching frequency relative to the frequency of an input signal and operate the amplifier in a band higher than that of the switching frequency.

At this time, the gain and the band are in a trade-off relationship in a single amplifier. In addition, the amplifier that performs feedback has a band narrowed due to addition of a circuit for phase compensation to prevent oscillation.

For the circuit for phase compensation, a capacitive element having a large capacitance value and a resistive element having a large resistance value are used, and the circuit tends to increase in size as a whole and a chip on which the circuit is mounted tends to increase in size. Increase in the size of the chip may increase the cost.

Meanwhile, in the embodiment, the differential amplification processing can be performed by the GM amplifier 4 and the capacitive element C1 while offset correction is performed in real time in the amplifier circuit 1, and thus, a high-accuracy and wide-band differential amplification can be achieved. This configuration makes it possible to achieve the high-accuracy and wide-band differential amplification without adding the circuit for the phase compensation, and thus, chip size can be readily reduced. The capacitive element C1 also used as phase compensation for a voltage follower state of the GM amplifier 5 enables reduction in chip size.

Figure 6:
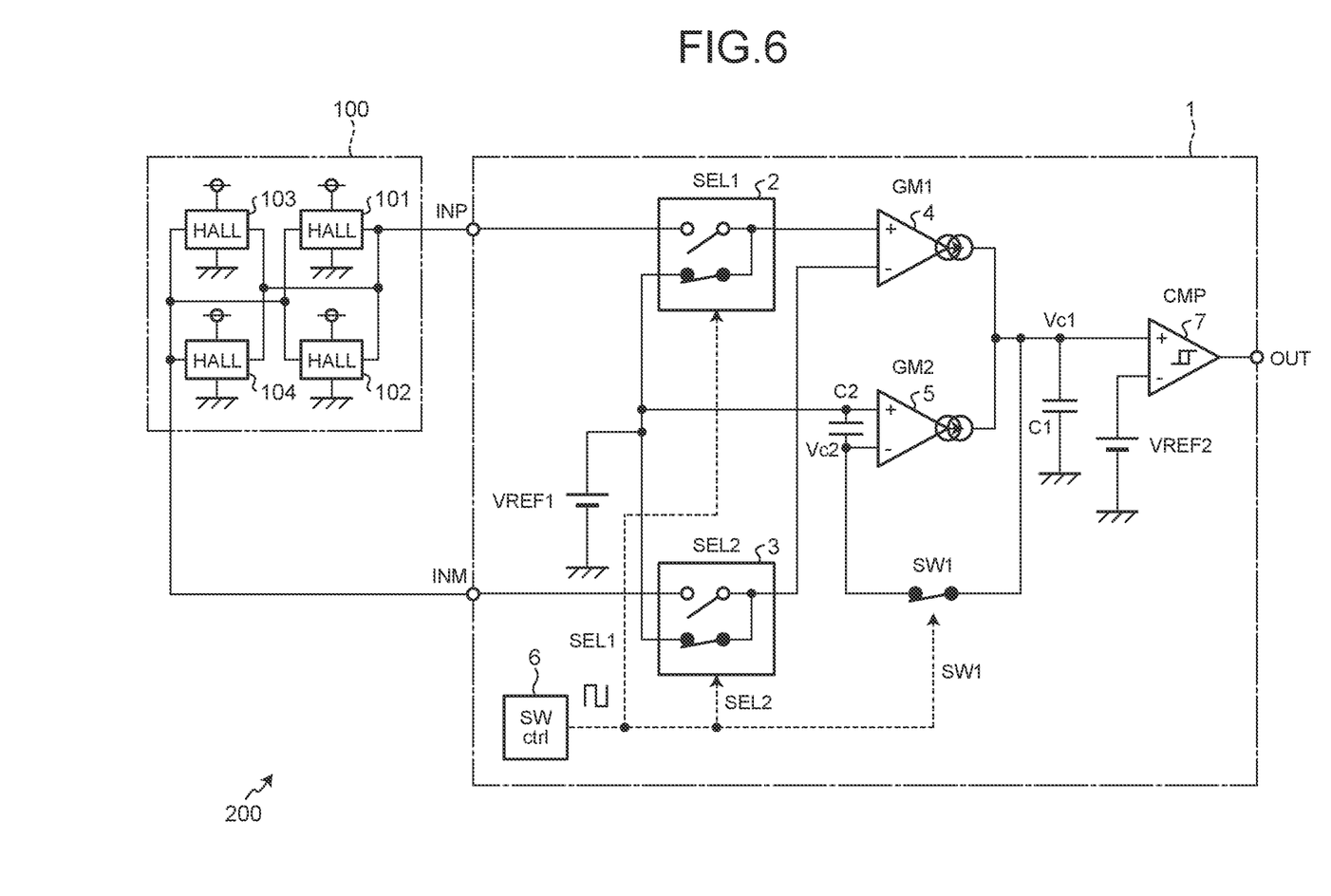
FIG. 6 is a diagram illustrating a configuration of a sensor circuit including an amplifier circuit according to a first modification of the embodiment.

Note that as a first modification of the embodiment, the amplifier circuit 1 may be applied to a sensor 100 and configured as a sensor circuit 200, as illustrated in FIG. 6. FIG. 6 is a diagram illustrating a configuration of the sensor circuit 200 including the amplifier circuit 1 according to the first modification of the embodiment.

The sensor circuit 200 includes the sensor 100 and the amplifier circuit 1. The amplifier circuit 1 may have a configuration similar to that of the amplifier circuit 1 of the embodiment. The sensor 100 detects a predetermined physical quantity and outputs a result of the detection as the differential signal. The sensor 100 is connected to differential input terminals INP and INM of the amplifier circuit 1.

The sensor 100 is, for example, a magnetic sensor, and includes plural Hall elements 101 to 104. The plural Hall elements 101 to 104 is connected in parallel between the differential input terminals INP and INM. The Hall elements 101 to 104 includes left and right terminals as illustrated in FIG. 6 that are connected to the input terminal INP and the input terminal INM. FIG. 6 illustrates a configuration of constant voltage drive in which power supply potential and ground potential are connected to upper and lower terminals of each of the Hall element 101 to 104 in FIG. 6, but instead of the power supply potential and the ground potential, one end and the other end of a current source may be connected to the upper and lower terminals in FIG. 6 to perform constant current drive.

The sensor 100 is used to detect a rotational position of a motor (e.g., brushless motor). The plural Hall elements 101 to 104 is installed in symmetrical directions on the same chip, and signals to be detected are substantially the same (the same in signal level). Therefore, each of the Hall elements 101 to 104 includes the offset component in a detected signal, but in the sensor 100, the plural Hall elements 101 to 104 are connected in parallel, combines induced voltages of the Hall elements 101 to 104, generates the offset components having different polarities, thereby cancelling the offset components.

As described above, in the first modification of the embodiment, the sensor 100 (e.g., a magnetic sensor) and the amplifier circuit 1 are combined to form the sensor circuit 200. This configuration makes it possible to constitute the sensor circuit 200 (e.g., a magnetic sensor circuit) having a small chip size and high accuracy.

Figure 7:
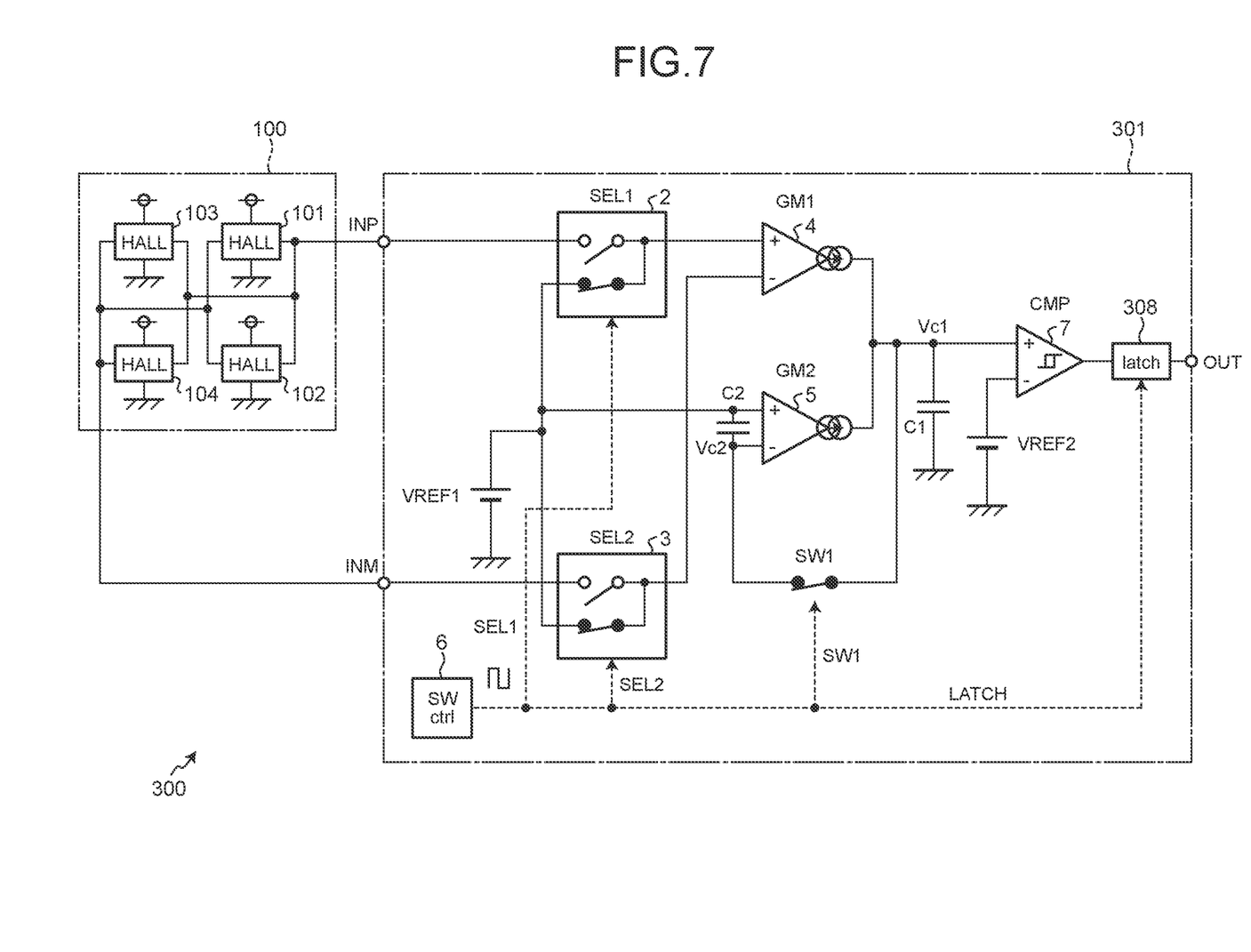
FIG. 7 is a diagram illustrating a configuration of a sensor circuit including an amplifier circuit according to a second modification of the embodiment.

Alternatively, as a second modification of the embodiment, an amplifier circuit 301 in a sensor circuit 300 may be devised for stabilized output, as illustrated in FIG. 7. FIG. 7 is a diagram illustrating a configuration of the sensor circuit 300 including the amplifier circuit 301 according to the second modification of the embodiment.

In the sensor circuit 300, the amplifier circuit 301 further includes a latch circuit 308. The latch circuit 308 is connected between the comparator 7 and the output terminal OUT. The latch circuit 308 latches the output from the comparator 7 in synchronization with a control signal LATCH from the control circuit 6. In a period shorter than a response time of the circuit of the phases PH1 and PH2, there is a possibility that a result of the determination by the comparator 7 may be unstable in level due to the influence of the disturbance noise during transition. Therefore, the control circuit 6 outputs the control signal LATCH so as to have a fetch-enable state (H level) in a short time slot (see FIG. 3) immediately before shifting from the phase PH2 to the phase PH1, and to have a hold state (L level) in the other time slots. The latch circuit 308 starts latching a result of the determination by the comparator 7 after the beginning of the phase PH2, and completes latching of the result of the determination by the comparator 7 before the end of the phase PH2. This configuration makes it possible for the latch circuit 308 to hold the result of the determination (result of the determination by an amplified signal) of the phase PH2 immediately before PH1 to hold correct determination.

As described above, in the second modification of the embodiment, in the amplifier circuit 301 of the sensor circuit 300, the result of the determination by the comparator 7 is held in the latch circuit 308, thus holding the correct determination. Therefore, it is possible to constitute the sensor circuit 300 (e.g., magnetic sensor circuit) having higher accuracy.

Figure 8:
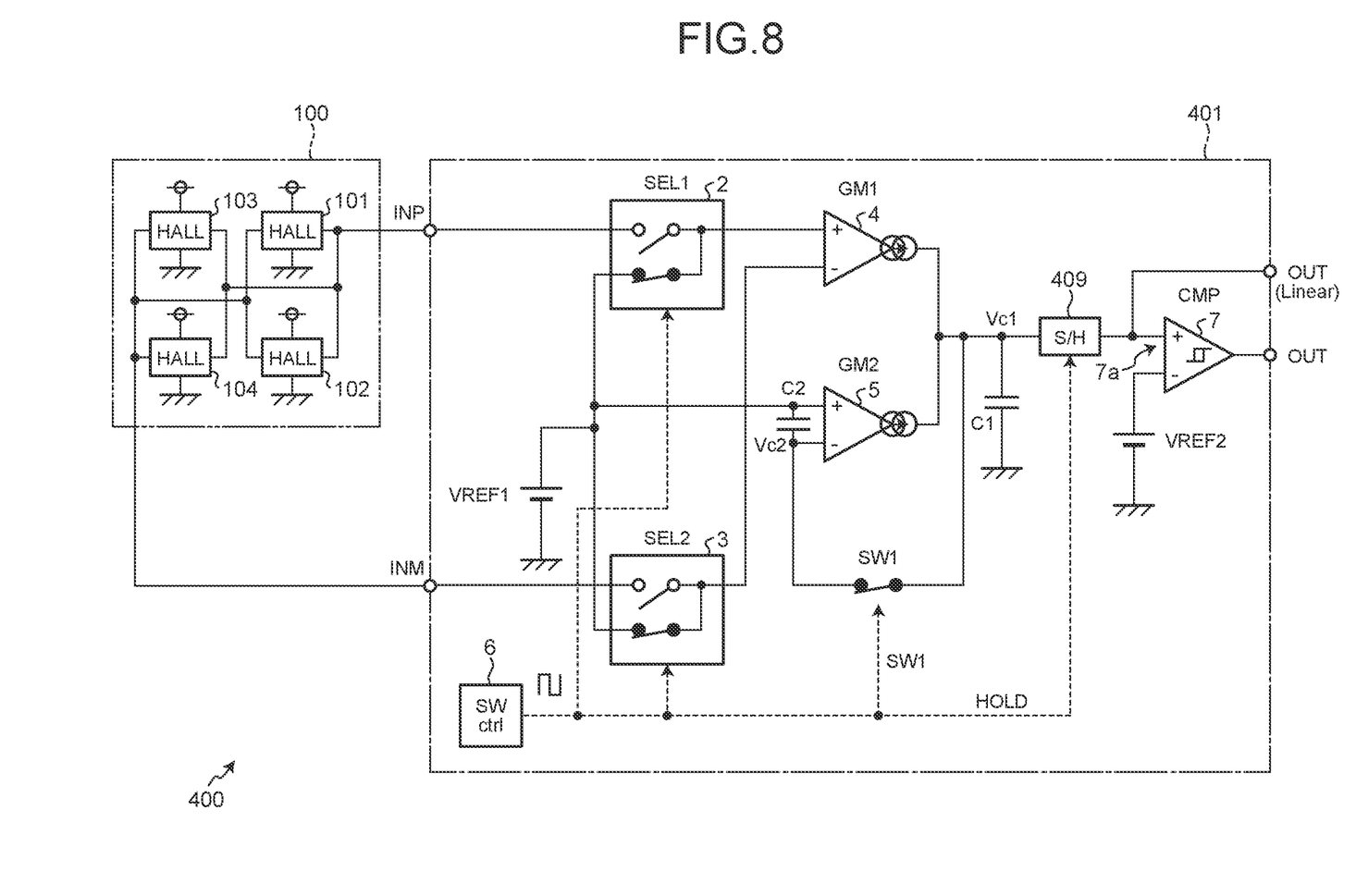
FIG. 8 is a diagram illustrating a configuration of a sensor circuit including an amplifier circuit according to a third modification of the embodiment.

Alternatively, as a third modification of the embodiment, a sample/hold circuit may be provided for processing of the amplified signal of an amplifier circuit 401 in a sensor circuit 400, as illustrated in FIG. 8. FIG. 8 is a diagram illustrating a configuration the sensor circuit 400 including the amplifier circuit 401 according to the third modification of the embodiment.

In the sensor circuit 400, the amplifier circuit 401 includes a sample/hold circuit 409. The sample/hold circuit 409 is connected between the capacitive element C1 and the comparator 7. The sample/hold circuit 409 holds an output as an analog value in synchronization with a control signal HOLD from the control circuit 6. The sample/hold circuit 409 includes an input node that is connected to the one end of the capacitive element C1, an output node that is connected to the non-inverting input terminal 7a of the comparator 7 and an output terminal OUT for a linear Hall sensor, and a control node that is connected to the control circuit 6. The sample/hold circuit 409 performs sampling of voltage of the capacitive element C1 in response to the H level of the control signal HOLD received at a control node, and holds the voltage of the capacitive element C1 in response to the L level of the control signal HOLD received at the control node. The control signal HOLD can be a signal that periodically changes between the H level and the L level, faster than the transition cycle of the phases PH1 and PH2. Since the voltage Vc1 is converted to a discrete signal (see FIG. 3), the voltage Vc1 can be demodulated into an analog signal through the sample/hold circuit 409.

As described above, in the third modification of the embodiment, the analog signal obtained by amplifying the sensor signal can be generated in the amplifier circuit 401 of the sensor circuit 400, and thus, the linear Hall sensor can be configured.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An amplifier circuit comprising:
   a first capacitive element;
   a first GM amplifier that includes a first input node, a second input node, and an output node, the output node being connected to one end of the first capacitive element;
   a second GM amplifier that includes a first input node, a second input node, and an output node, the output node being connected to the one end of the first capacitive element;
   a switch that has one end connected to the output node of the second GM amplifier, and the other end connected to the second input node of the second GM amplifier;
   a second capacitive element that has one end connected to the first input node of the second GM amplifier, and the other end connected to the second input node of the second GM amplifier;
   a first selector circuit that switches between a first state and a second state, the first state being a state where a first input terminal and the first input node of the first GM amplifier are connected, the second state being a state where first reference voltage and the first input node of the first GM amplifier are connected; and
   a second selector circuit that switches between a third state and a fourth state, the third state being a state where a second input terminal and the second input node of the first GM amplifier are connected, the fourth state being a state where the first reference voltage and the second input node of the first GM amplifier are connected,
   wherein the first reference voltage is connected to the first input node of the second GM amplifier.

2. The amplifier circuit according to claim 1, further comprising
   a control circuit that includes an output node, the output node being connected to a control terminal of the first selector circuit, a control terminal of the second selector circuit, and a control terminal of the switch.

3. The amplifier circuit according to claim 2, wherein the control circuit, in a first period, maintains the switch in an on state, maintains the first selector circuit in the second state, and maintains the second selector circuit in the fourth state, and in a second period, maintains the switch in an off state, maintains the first selector circuit in the first state, and maintains the second selector circuit in the third state.

4. The amplifier circuit according to claim 3, wherein the second period follows the first period.

5. The amplifier circuit according to claim 2, wherein the control circuit, in a first period, maintains the switch in an on state, maintains the first selector circuit in the second state, and maintains the second selector circuit in the fourth state, in a second period following the first period, maintains the switch in an off state, maintains the first selector circuit in the first state, and maintains the second selector circuit in the third state, in a third period following the second period, maintains the switch in an on state, maintains the first selector circuit in the second state, and maintains the second selector circuit in the fourth state, and in a fourth period following the third period, maintains the switch in an off state, maintains the first selector circuit in the first state, and maintains the second selector circuit in the third state.

6. The amplifier circuit according to claim 1, further comprising
   a comparator that includes a first input node to which the first capacitive element is connected, and a second input node to which second reference voltage is connected.

7. The amplifier circuit according to claim 6, wherein the comparator has a hysteresis characteristic.

8. The amplifier circuit according to claim 7, wherein the comparator performs comparison by using a first threshold voltage when voltage of the first capacitive element rises, and performs comparison by using a second threshold voltage when the voltage of the first capacitive element lowers.

9. The amplifier circuit according to claim 8, wherein the first threshold voltage corresponds to the second reference voltage, and
the second threshold voltage corresponds to a voltage decreased from the second reference voltage by a predetermined voltage.

10. The amplifier circuit according to claim 8, wherein the comparator, when the voltage of the first capacitive element rises, outputs a first level if the voltage of the first capacitive element is lower than the first threshold voltage, outputs a second level if the voltage of the first capacitive element exceeds the first threshold voltage, and when the voltage of the first capacitive element lowers, outputs the second level if the voltage of the first capacitive element is higher than the first threshold voltage, and outputs the first level if the voltage of the first capacitive element is lower than the first threshold voltage.

11. The amplifier circuit according to claim 1, wherein the second GM amplifier operates as a voltage follower to which the first reference voltage is input, in a state where the switch is maintained in an on state.

12. The amplifier circuit according to claim 11, wherein the operation of the second GM amplifier as the voltage follower is cancelled in a state where the switch is maintained in an off state.

13. The amplifier circuit according to claim 6, further comprising
a latch circuit that is connected between the comparator and an output node of the amplifier circuit.

14. The amplifier circuit according to claim 3, further comprising:
a comparator that includes a first input node to which the first capacitive element is connected and a second input node to which a second reference voltage is connected; and
a latch circuit that is connected between the comparator and an output node of the amplifier circuit,
wherein the latch circuit starts latching an output of the comparator after beginning of the second period, and completes latching the output of the comparator before the end of the second period.

15. The amplifier circuit according to claim 5, further comprising:
a comparator that includes a first input node to which the first capacitive element is connected and a second input node to which a second reference voltage is connected; and
a latch circuit that is connected between the comparator and an output node of the amplifier circuit,
wherein the latch circuit starts latching an output of the comparator after beginning of the second period, completes latching the output of the comparator before the end of the second period, starts latching the output of the comparator after beginning of the fourth period, and completes latching the output of the comparator before the end of the fourth period.

16. The amplifier circuit according to claim 6, further comprising
a sample/hold circuit that is connected between the one end of the first capacitive element and the comparator.

17. The amplifier circuit according to claim 16, wherein the sample/hold circuit performs sampling of voltage of the first capacitive element in response to a second level of a control signal received by a control node, and holds the voltage of the first capacitive element in response to a first level of a control signal received by the control node.

18. The amplifier circuit according to claim 1, wherein the first selector circuit includes:
a second switch that has one end connected to the first input terminal and the other end connected to the first input node of the first GM amplifier; and
a third switch that has one end connected to the first reference voltage and the other end connected to the first input node of the first GM amplifier; and
the second selector circuit includes:
a fourth switch that has one end connected to the second input terminal and the other end connected to the second input node of the first GM amplifier; and
a fifth switch that has one end connected to the first reference voltage and the other end connected to the second input node of the first GM amplifier.

19. A sensor circuit comprising:
a sensor; and
the amplifier circuit according to claim 1 that is connected to the sensor.

20. The sensor circuit according to claim 19, wherein the sensor includes plural Hall elements that is installed mutually in symmetrical directions on an identical chip and that detects substantially the same signals.

* * * * *